United States Patent
Lee (10) Patent No.: US 11,004,481 B2
(45) Date of Patent: May 11, 2021

(54) INTERNAL VOLTAGE GENERATION DEVICE AND METHOD FOR GENERATING INTERNAL VOLTAGE

(71) Applicant: SK hynix Inc., Gyeonggi-do (KR)

(72) Inventor: Sang-Hoon Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/544,999

(22) Filed: Aug. 20, 2019

(65) Prior Publication Data

US 2020/0202902 A1 Jun. 25, 2020

(30) Foreign Application Priority Data

Dec. 24, 2018 (KR) ........................ 10-2018-0168377

(51) Int. Cl.
*G11C 5/14* (2006.01)
*G11C 8/08* (2006.01)
*H02M 3/07* (2006.01)

(52) U.S. Cl.
CPC .............. *G11C 5/147* (2013.01); *G11C 5/145* (2013.01); *G11C 8/08* (2013.01); *H02M 3/07* (2013.01)

(58) Field of Classification Search
CPC ........... G11C 5/147; G11C 5/145; G11C 8/08; H02M 3/07
USPC .................................................. 365/189.09
See application file for complete search history.

(56) References Cited

U.S. PATENT DOCUMENTS

| 2009/0059701 A1* | 3/2009 | Byeon | G11C 7/04 365/205 |
| 2009/0206664 A1* | 8/2009 | Sasaki | G09G 3/3696 307/33 |
| 2010/0289561 A1* | 11/2010 | Choi | G11C 5/143 327/538 |
| 2011/0298499 A1* | 12/2011 | Seol | G11C 11/4074 327/77 |

FOREIGN PATENT DOCUMENTS

KR 10-2007-0036640 4/2007
KR 10-2007-0043311 4/2007

* cited by examiner

*Primary Examiner* — Anthan Tran
(74) *Attorney, Agent, or Firm* — IP & T Group LLP (57) ABSTRACT

An internal voltage generation device includes: a voltage detection circuit generating a first detection signal by comparing a first voltage with a target voltage; a voltage difference detection circuit enabled in response to an operation enable signal, generating a second detection signal by comparing a voltage difference between the first voltage and a second voltage with a target gap voltage; a control circuit generating a first up/down code and the operation enable signal according to the first detection signal, and generating a second up/down code according to the second detection signal; a first voltage generation circuit generating the first voltage by down-converting a supply voltage, and adjusting a level of the first voltage according to the first up/down code; and a second voltage generation circuit generating the second voltage by boosting up the supply voltage, and adjusting a level of the second voltage according to the second up/down code.

9 Claims, 8 Drawing Sheets

INTERNAL VOLTAGE GENERATION DEVICE AND METHOD FOR GENERATING INTERNAL VOLTAGE

CROSS-REFERENCE TO RELATED APPLICATIONS

The present application claims priority of Korean Patent Application No. 10-2018-0168377, filed on Dec. 24, 2018, which is incorporated herein by reference in its entirety.

BACKGROUND

1. Field

Various embodiments of the present invention relate to semiconductor design technology, and more particularly, to an internal voltage generation device of a semiconductor memory device.

2. Description of the Related Art

Generally, a semiconductor memory device receives a supply voltage (VDD) and a ground voltage (VSS) from the outside and generates internal voltages required for internal operations by using the supply voltage and the ground voltage. Examples of the voltage required for the internal operations of the memory device may include a core voltage (VCORE) supplied to a memory core region, a boosted voltage (VPP) used for driving a word line, a back-bias voltage (VBB) supplied as a bulk voltage of an NMOS transistor of the core region, and the like.

Here, the core voltage (VCORE) may be generated by lowering (i.e., down-converting) the externally provided supply voltage (VDD) by a predetermined voltage. Meanwhile, since the boosted voltage (VPP) has a higher voltage level than the supply voltage (VDD) and the back-bias voltage (VBB) has a voltage level lower than the externally provided ground voltage (VSS), a circuit for performing a charge pumping operation of supplying electric charges is required in order to generate the boosted voltage (VPP) and the back-bias voltage (VBB).

Since the internal voltages are generated in an internal voltage generation circuit, the level changes of the internal voltages according to changes in the internal temperature may have different tendencies. For example, when a level of the core voltage (VCORE) may be raised as the internal temperature changes, a level of the boosted voltage (VPP) may be decreased. In this case, a write recovery time (i.e., tWR) failure may be caused.

SUMMARY

Embodiments of the present invention are directed to an internal voltage generation device capable of maintaining a predetermined voltage difference between a core voltage and a boosted voltage of a semiconductor memory device, and a method for generating an internal voltage.

In accordance with an embodiment of the present invention, an internal voltage generation device includes: a voltage detection circuit generating a first detection signal by comparing a first voltage with a target voltage; a voltage difference detection circuit enabled in response to an operation enable signal, generating a second detection signal by comparing a voltage difference between the first voltage and a second voltage with a target gap voltage; a control circuit generating a first up/down code and the operation enable signal according to the first detection signal, and generating a second up/down code according to the second detection signal; a first voltage generation circuit generating the first voltage by down-converting a supply voltage, and adjusting a level of the first voltage according to the first up/down code; and a second voltage generation circuit generating the second voltage by boosting up the supply voltage, and adjusting a level of the second voltage according to the second up/down code.

In accordance with another embodiment of the present invention, a method for generating an internal voltage includes: comparing a first voltage with a target voltage; increasing a level of the first voltage when a level of the first voltage is lower than a level of the target voltage; comparing a voltage difference between the first voltage and a second voltage with a target gap voltage in response to an operation enable signal to produce a comparison result; and adjusting a level of the second voltage according to the comparison result.

In accordance with another embodiment of the present invention, a semiconductor device includes: generating a down-converted voltage by down-converting a supply voltage; and a boosted voltage generation circuit suitable for generating a boosted voltage by boosting up the supply voltage, wherein the down-converted voltage generation circuit increases a level of the down-converted voltage when a level of the down-converted voltage is lower than a level of target voltage, and wherein the boosted voltage generation circuit increases a level of the boosted voltage when a voltage difference between the down-converted voltage and the boosted voltage is smaller than a target gap voltage, and decreases the level of the boosted voltage when the voltage difference is equal to or greater than the target gap voltage.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

As used herein, singular forms may include the plural forms as well and vice versa, unless the context clearly indicates otherwise. The articles 'a' and 'an' as used in this application and the appended claims should generally be construed to mean 'one or more' unless specified otherwise or clear from context to be directed to a singular form.

Figure 1:
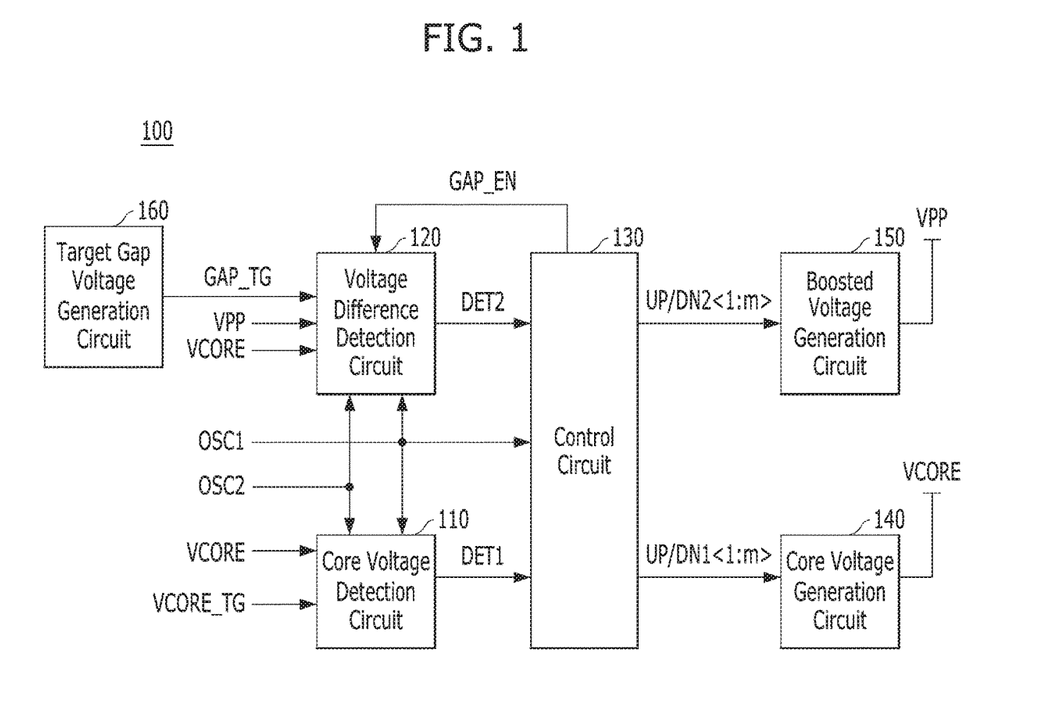
FIG. 1 is a block diagram illustrating an internal voltage generation device in accordance with an embodiment of the present invention.

FIG. 1 is a block diagram illustrating an internal voltage generation device 100 in accordance with an embodiment of the present invention. In the present embodiment, a core voltage (VCORE) is used as an example of a voltage obtained by down-converting a supply voltage (VDD), and a boosted voltage (VPP) is used as an example of a voltage obtained by boosting the supply voltage (i.e., by a charge pumping operation).

Referring to FIG. 1, the internal voltage generation device 100 may include a core voltage detection circuit 110, a voltage difference detection circuit 120, a control circuit 130, a core voltage generation circuit 140, and a boosted voltage generation circuit 150.

The core voltage detection circuit 110 may generate a first detection signal DET1 by comparing a core voltage VCORE and a target core voltage VCORE_TG. For example, the core voltage detection circuit 110 may output the first detection signal DET1 at a logic high level when a level of the core voltage VCORE is lower than a level of the target core voltage VCORE_TG. The core voltage detection circuit 110 may output the first detection signal DET1 at a logic low level when a level of the core voltage VCORE is equal to or higher than a level of the target core voltage VCORE_TG. The core voltage detection circuit 110 may output the first detection signal DET1 at a logic high level when a level of the core voltage VCORE is lower than a level of the target core voltage VCORE_TG. Meanwhile, the core voltage detection circuit 110 may perform a comparison operation according to a first period signal OSC1, and output the first detection signal DET1 according to a second period signal OSC2. The first period signal OSC1 and the second period signal OSC2 may be signals having the same period but activated at different timings. For example, the first period signal OSC1 and the second period signal OSC2 may be signals having a phase difference of approximately 180 degrees.

The voltage difference detection circuit 120 may be enabled according to an operation enable signal GAP_EN, compare the voltage difference between the core voltage VCORE and the boosted voltage VPP with a pre-set target gap voltage GAP_TG to generate a second detection signal DET2. The voltage difference detection circuit 120 may output the second detection signal DET2 at a logic high level when the voltage difference is smaller than the target gap voltage GAP_TG. The voltage difference detection circuit 120 may output the second detection signal DET2 at a logic low level when the voltage difference is equal to or greater than the target gap voltage GAP_TG. Meanwhile, the voltage difference detection circuit 120 may perform a comparison operation according to the first period signal OSC1, and output the second detection signal DET2 according to the second period signal OSC2.

The control circuit 130 may generate a first up/down code UP/DN1<1:m> and the operation enable signal GAP_EN according to the first detection signal DET1. For example, when a level of the core voltage VCORE is lower than a level of the target core voltage VCORE_TG and the first detection signal DET1 becomes a logic high level, the control circuit 130 may control the first up/down code UP/DN1<1:m> to raise the level of the core voltage VCORE. Conversely, when a level of the core voltage VCORE is equal to or higher than a level of the target core voltage VCORE_TG and the first detection signal DET1 becomes a logic low level, the control circuit 130 may omit an operation of adjusting the level of the core voltage VCORE by not controlling the first up/down code UP/DN1<1:m>, and may activate the operation enable signal GAP_EN.

Also, the control circuit 130 may generate a second up/down code UP/DN2<1:m> according to the second detection signal DET2. For example, when the voltage difference is smaller than the target gap voltage GAP_TG and the second detection signal DET2 becomes a logic high level, the control circuit 130 may control the second up/down code UP/DN2<1:m> to raise the level of the boosted voltage VPP. Conversely, when a level of the voltage difference is equal to or higher than a level of the target gap voltage GAP_TG and the second detection signal DET2 becomes a logic low level, the control circuit 130 may control the second up/down code UP/DN2<1:m> to lower the level of the boosted voltage VPP. Meanwhile, the control circuit 130 may output the first up/down code UP/DN1<1: m>, the operation enable signal GAP_EN, and the second up/down code UP/DN2<1:m> according to the first period signal OSC1.

The core voltage generation circuit 140 may generate a core voltage VCORE based on the supply voltage VDD, and control the level of the core voltage VCORE according to on the first up/down code UP/DN1<1:m>. The core voltage generation circuit 140 may generate the core voltage VCORE by down-converting the supply voltage VDD. The boosted voltage generation circuit 150 may generate the boosted voltage VPP by boosting up the supply voltage VDD, and control the level of the boosted voltage VPP according to the second up/down code UP/DN2<1:m>.

Meanwhile, the internal voltage generation device 100 may include a target gap voltage generation circuit 160 for generating the target gap voltage GAP_TG. According to the embodiment of the present invention, the target gap voltage generation circuit 160 may generate the target gap voltage GAP_TG according to a temperature code (not shown) that represents temperature information in the inside of the semiconductor memory device or an error correction operation signal (not shown) that represents whether an error correction operation is performed or not.

Figure 2:
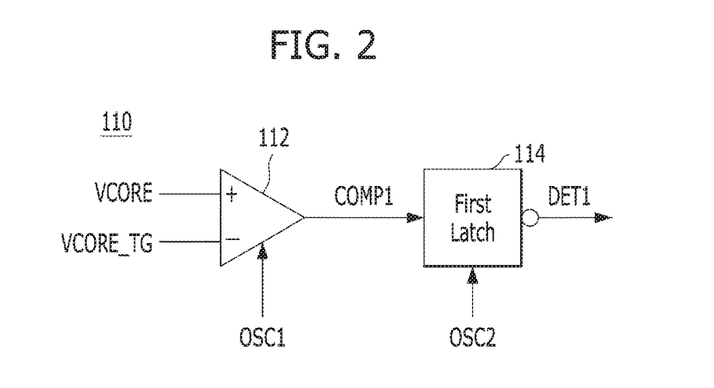
FIG. 2 is a detailed block diagram of a core voltage detection circuit shown in FIG. 1.

FIG. 2 is a detailed block diagram of the core voltage detection circuit 110 shown in FIG. 1.

Referring to FIG. 2, the core voltage detection circuit 110 may include a first comparator 112 and a first latch 114.

The first comparator 112 may compare the core voltage VCORE with the target core voltage VCORE_TG according to the first period signal OSC1 to output a first comparison signal COMP1. The first comparator 112 may be enabled in response to the first period signal OSC1. The first comparator 112 may output a first comparison signal COMP1 having a logic high level when a level of the core voltage VCORE is equal to or higher than a level of the target core voltage VCORE_TG, and output the first comparison signal COMP1 having a logic low level when a level of the core voltage VCORE is lower than a level of the target core voltage VCORE_TG.

The first latch unit 114 may latch the first comparison signal COMP1, and output the latched first comparison signal COMP1 in response to the second period signal OSC2 as the first detection signal DET1. According to an embodiment of the present invention, the first latch 114 may invert the latched first comparison signal COMP1 to output the inverted signal as the first detection signal DET1.

Figure 3:
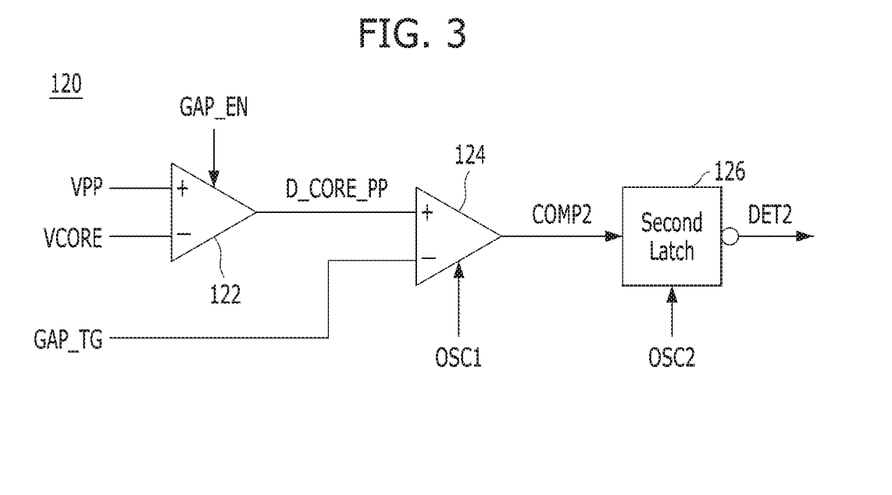
FIG. 3 is a detailed block diagram of a voltage difference detection circuit shown in FIG. 1.

FIG. 3 is a detailed block diagram of the voltage difference detection circuit 120 shown in FIG. 1.

Referring to FIG. 3, the voltage difference detection circuit 120 may include an analog subtractor 122, a second comparator 124, and a second latch 126.

The analog subtractor 122 may be enabled in response to the operation enable signal GAP_EN, and output a voltage difference signal D_CORE_PP corresponding to the voltage difference between the core voltage VCORE and the boosted voltage VPP. Herein, the voltage difference signal D_CORE_PP may have an analog value corresponding to the voltage difference between the core voltage VCORE and the boosted voltage VPP. For example, when the core voltage VCORE is approximately 600 mV and the boosted voltage VPP is approximately 1.0 V, the analog subtractor 122 may output a voltage difference signal D_CORE_PP having an analog value of approximately 400 mV.

The second comparator 124 may compare the voltage difference signal D_CORE_PP with the target gap voltage GAP_TG according to the first period signal OSC1 to output the second comparison signal COMP2. The second comparator 124 may be enabled in response to the first period signal OSC1 and, when the voltage difference signal D_CORE_PP is equal to or greater than the target gap voltage GAP_TG, output a second comparison signal COMP2 having a logic high level, and, when the voltage difference signal D_CORE_PP is smaller than the target gap voltage GAP_TG, output a second comparison signal COMP2 having a logic low level.

The second latch 126 may latch the second comparison signal COMP2, and output the latched second comparison signal COMP2 in response to the second period signal OSC2 as the second detection signal DET2. According to an embodiment of the present invention, the second latch unit 126 may invert the latched second comparison signal COMP2 to output the inverted signal as the second detection signal DET2.

Figure 4:
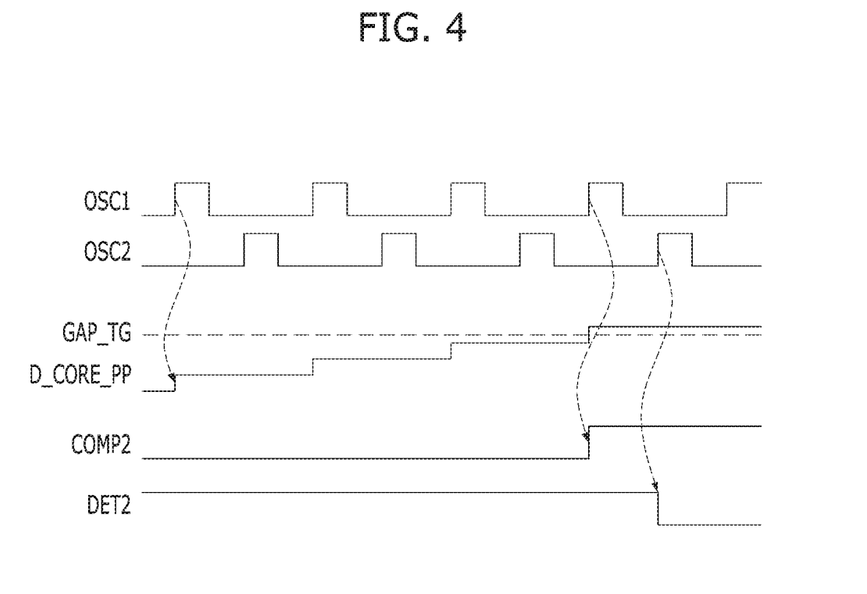
FIG. 4 is a timing diagram for describing an operation of the voltage difference detection circuit shown in FIG. 3.

FIG. 4 is a timing diagram for describing an operation of the voltage difference detection circuit 120 shown in FIG. 3. In FIG. 4, it may be assumed that the operation enable signal GAP_EN is activated.

Referring to FIG. 4, the analog subtractor 122 may output a voltage difference signal D_CORE_PP corresponding to the voltage difference between the core voltage VCORE and the boosted voltage VPP.

The second comparator 124 may output the second comparison signal COMP2 having a logic low level when the voltage difference signal D_CORE_PP is smaller than the target gap voltage GAP_TG according to the first period signal OSC1. The second latch 126 may invert the latched second comparison signal COMP2 to output the inverted signal as the second detection signal DET2 having a logic high level. The control circuit 130 may adjust the second up/down code UP/DN2<1:m> according to the second detection signal DET2 having a logic high level, and output the second up/down code UP/DN2<1:m> according to the first period signal OSC1. The boosted voltage generation circuit 150 may raise the level of the boosted voltage VPP according to the second up/down code UP/DN2<1:m>. Accordingly, the analog subtractor 122 may output a voltage difference signal D_CORE_PP that has been raised to a predetermined voltage level.

When the operation is repeatedly performed and the voltage difference signal D_CORE_PP is equal to or greater than the target gap voltage GAP_TG, the second comparator 124 may output the second comparison signal COMP2 having a logic high level according to the first period signal OSC1, and the second latch 126 may output the second detection signal DET2 of the logic low level according to the second period signal OSC2.

The control circuit 130 may adjust the second up/down code UP/DN2<1:m> according to the second detection signal DET2 having a logic low level, and the boosted voltage generation circuit 150 may decrease a level of the boosted voltage VPP according to the second up/down code UP/DN2<1:m>.

Through such an operation, the voltage difference signal D_CORE_PP may toggle in a range adjacent to a level of the target gap voltage GAP_TG.

Figure 5:
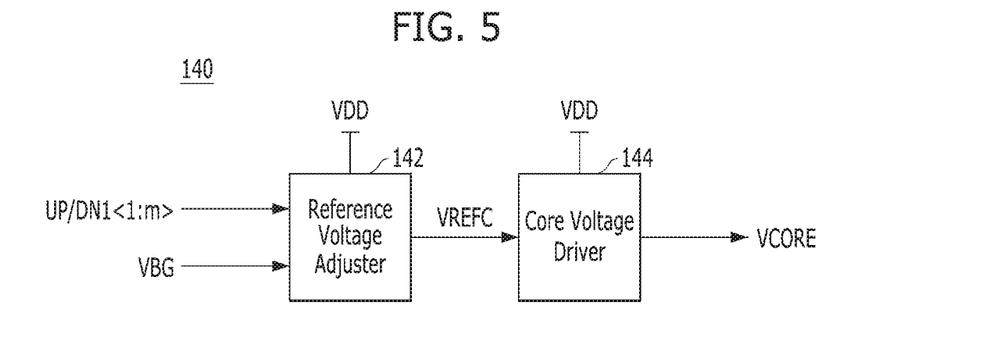
FIG. 5 is a detailed block diagram of a core voltage generation circuit shown in FIG. 1.

FIG. 5 is a detailed block diagram of the core voltage generation circuit 140 shown in FIG. 1.

Referring to FIG. 5, the core voltage generation circuit 140 may include a reference voltage adjuster 142 and a core voltage driver 144.

The reference voltage adjuster 142 may adjust a level of a first reference voltage VREFC according to the first up/down code UP/DN1<1: m>.

The core voltage driver 144 may drive the supply voltage VDD according to the first reference voltage VREFC to output the core voltage VCORE.

Figure 6:
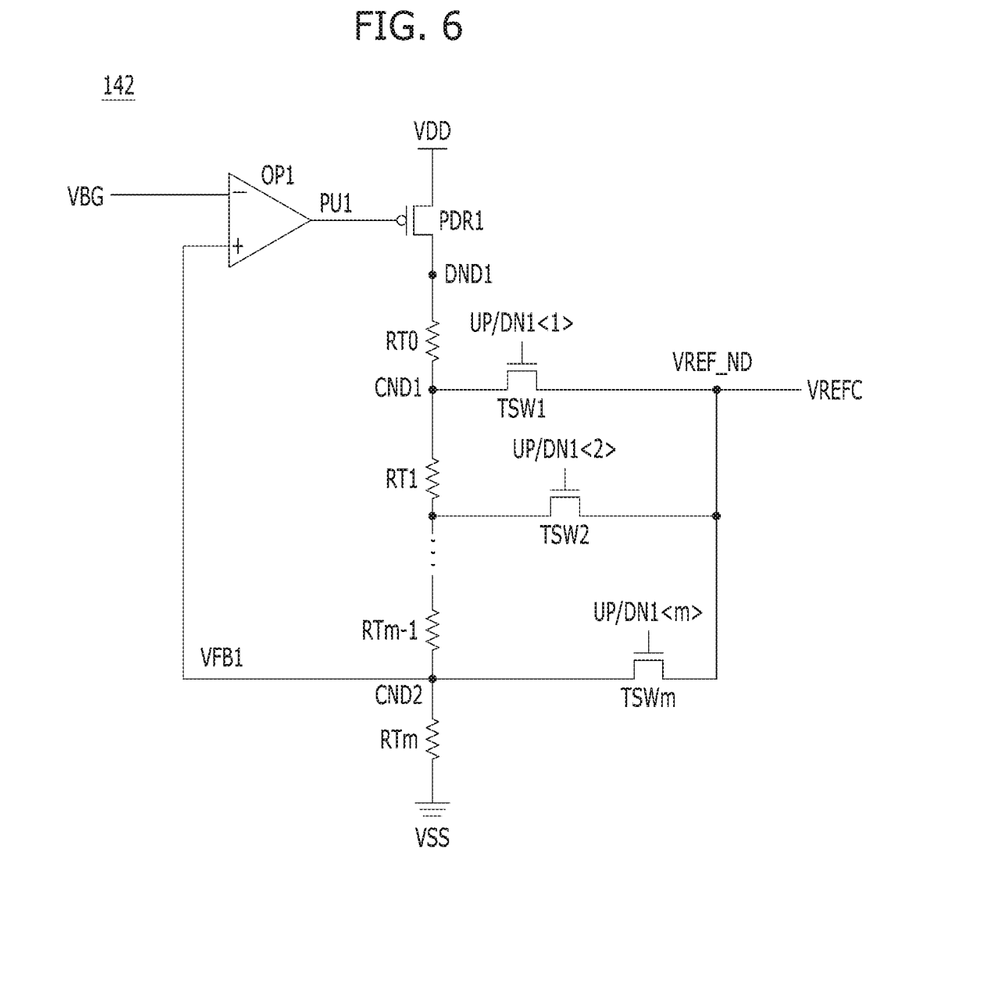
FIG. 6 is a detailed circuit diagram of a reference voltage adjuster shown in FIG. 5.

FIG. 6 is a detailed circuit diagram of the reference voltage adjuster 142 shown in FIG. 5.

Referring to FIG. 6, the reference voltage adjuster 142 may include a first comparator OP1, a pull-up driver PDR1, a plurality of trimming resistors RT0 to RTm, and a plurality of first switches TSW1 to TSWm. For example, the pull-up driver PDR1 may include a PMOS transistor, and the first switches TSW1 to TSWm may include transistors, for example, NMOS transistors.

The first comparator OP1 may compare a feedback voltage VFB1 and a bandgap voltage VBG with each other to output a drive control signal PU1. The band gap voltage VBG may be a voltage having a predetermined voltage level which is irrelevant to the changes in the voltage supplied from the outside. The first comparator OP1 may generate a drive control signal PU1 which is activated by a logic low level when the level of the feedback voltage VFB1 is lower than that of the bandgap voltage VBG.

The pull-up driver PDR1 may drive a first node DND1 with the supply voltage VDD according to the drive control signal PU1.

The trimming resistors RT0 to RTm may be coupled in series between the first node DND1 and the ground voltage VSS terminal. For reference, the feedback voltage VFB1 may be outputted from a common node CND2 of the last trimming resistors RTm-1 and RTm.

The first switches TSW1 to TSWm may be coupled between a common node of the neighboring trimming resistors and a reference voltage output node VREF_ND, respectively. For example, a first switch SW1 may be coupled between a common node CND1 of the first trimming resistor RT1 and the second trimming resistor RT2 and an output node VREF_ND of the first reference voltage VREFC. Each of the first switches TSW1 to TSWm may be turned on according to a corresponding bit of the first up/down code UP/DN1<1:m>.

With the above structure, the voltage of the first node DND1 may be determined by the trimming resistors RT0 to RTm, and a level of the first reference voltage VREFC outputted from the reference voltage output node VREF_ND may be determined depending on a status of a switch that is turned on among the first switches TSW1 to TSWm. For example, when the first switch TSW1 is turned on according to the first bit UP/DN1<1> of the first up/down code UP/DN1<1:m>, the voltage of the first node DND1 may be divided by a ratio of the first resistor RT0 and the remaining resistors RT1 to RTm, and the divided voltage, i.e., a voltage of the common node CND1, is outputted as the first reference voltage VREFC.

Figure 7:
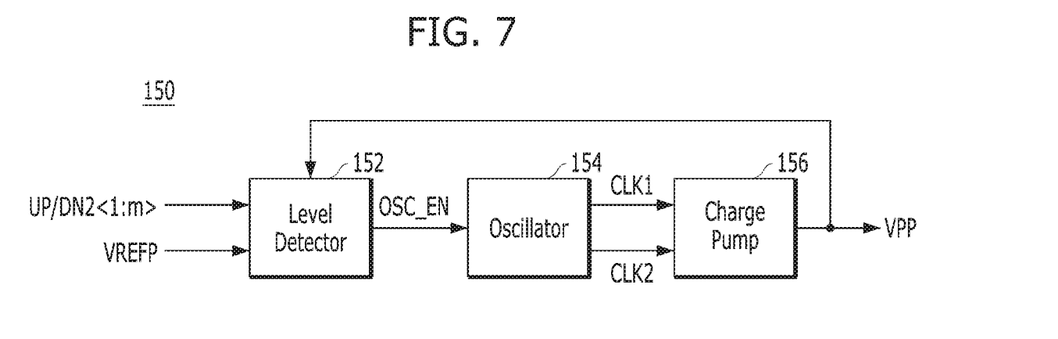
FIG. 7 is a detailed block diagram of a boosted voltage generation circuit shown in FIG. 1.

FIG. 7 is a detailed block diagram of the boosted voltage generation circuit 150 shown in FIG. 1.

Referring to FIG. 7, the boosted voltage generation circuit 150 may include a level detector 152, an oscillator 154, and a charge pump 156.

The level detector 152 may generate an adjusted voltage VADJ by adjusting a division ratio of the boosted voltage VPP according to the second up/down code UP/DN2<1:m>, and generate the oscillation control signal OSC_EN by comparing the second reference voltage VREFP with the adjusted voltage VADJ. For example, when a level of the adjusted voltage VADJ is equal to or higher than a level of the second reference voltage VREFP, the level detector 152 may activate the oscillation control signal OSC_EN by a logic high level. Conversely, when a level of the adjusted voltage VADJ is lower than the second reference voltage VREFP, the level detector 152 may deactivate the oscillation control signal OSC_EN by a logic low level.

The oscillator 154 may be enabled in response to the oscillation control signal OSC_EN to generate pumping control signals CLK1 and CLK2. The pumping control signals CLK1 and CLK2 may include a first clock signal CLK1 and a second clock signal CLK2 that have inverted phases to each other. The charge pump 156 may perform a charge pumping operation using the supply voltage VDD according to the pumping control signals CLK1 and CLK2 to generate a boosted voltage VPP.

Figure 8:
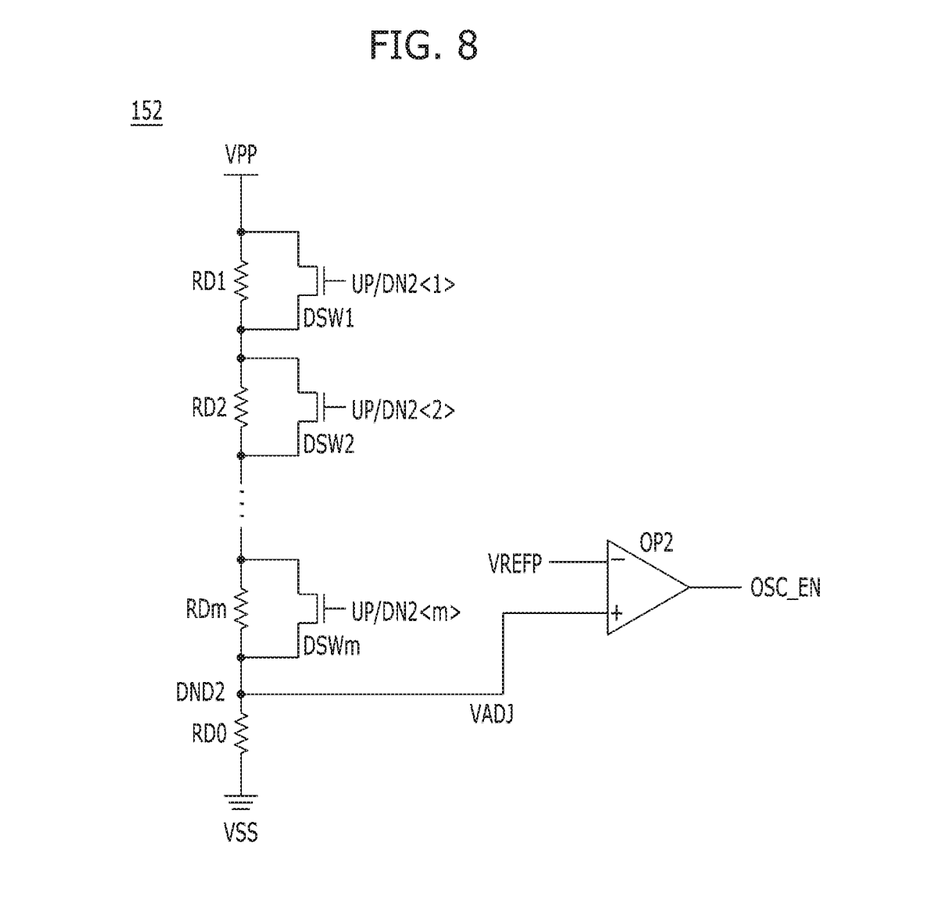
FIG. 8 is a detailed circuit diagram of a level detector shown in FIG. 7.

FIG. 8 is a detailed circuit diagram of the level detector 152 shown in FIG. 7.

Referring to FIG. 8, the level detector 152 may include a plurality of divided resistors RD1 to RDm, a base resistor RD0, a plurality of second switches DSW1 to DSWm, and a second comparator OP2. According to the embodiment of the present invention, the second switches DSW1 to DSWm may be formed of transistors, for example, NMOS transistors.

The divided resistors RD1 to RDm may be coupled in series between the supply voltage VDD terminal and a second node DND2. Herein, the adjusted voltage VADJ may be outputted from the second node DND2. The base resistor RD0 may be coupled between the second node DND2 and the ground voltage VSS terminal.

The second switches DSW1 to DSWm may correspond to the divided resistors RD1 to RDm, respectively, and may be coupled in parallel with the corresponding divided resistors. The second switches DSW1 to DSWm may be turned on according to a bit of the corresponding second up/down code UP/DN2<1:m>, individually.

The second comparator OP2 may compare the adjusted voltage VADJ outputted from the second node DND2 with the second reference voltage VREFP to output the oscillation control signal OSC_EN. When a level of the adjusted voltage VADJ is equal to or higher than a level of the second reference voltage VREFP, the second comparator OP2 may generate the oscillation control signal OSC_EN that is activated by a logic high level.

With the above structure, the voltage of the second node DND2 may be determined according to a ratio of the total resistance value of the divided resistors RD1 to RDm and the resistance of the base resistor RD0, and a level of the adjusted voltage VADJ outputted from the second node DND2 may be determined depending on a status of at least one switch that is turned on among the second switches DSW1 to DSWm. For example, when only the first switch DSW1 is turned on according to the first bit UP/DN2<1> of the second up/down code UP/DN2<1:m>, the voltage of the second node DND2 may be determined by a ratio of the total resistance value of divided resistors RD2 to RDm and the resistance of the base resistor RD0, and outputted as the adjusted voltage VADJ.

Figure 9:
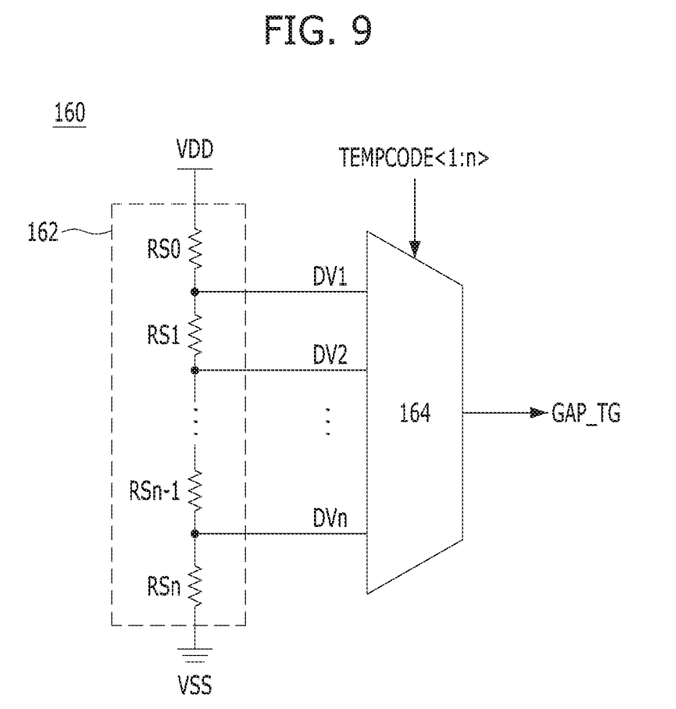
FIGS. 9 and 10 are detailed diagrams of a target gap voltage generation circuit shown in FIG. 1.

FIG. 9 is a detailed block diagram of an example of the target gap voltage generation circuit 160 shown in FIG. 1.

Referring to FIG. 9, the target gap voltage generation circuit 160 may include a resistance divider 162 and a selector 164.

The resistor divider 162 may include a plurality of resistors RS0 to RSn coupled in series between the supply voltage VDD terminal and the ground voltage VSS terminal to output a plurality of division voltages DV1 to DVn. The selector 164 may select one among the division voltages DV1 to DVn according to a temperature code TEMP-CODE<1:n>, and output the selected division voltage as a target gap voltage GAP_TG.

Figure 10:
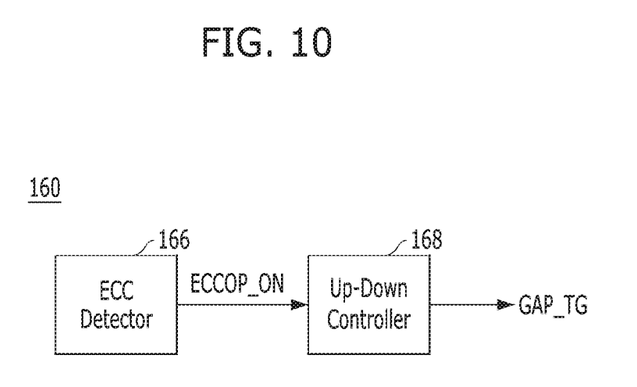

FIG. 10 is a detailed block diagram of another example of the target gap voltage generation circuit 160 shown in FIG. 1.

Referring to FIG. 10, the target gap voltage generation circuit 160 may include an error correction operation detector 166 and an up-down controller 168.

The error correction operation detector 166 may detect whether an error correction operation is performed or not to generate an error correction operation signal ECCOP_ON. The error correction operation signal ECCOP_ON may be activated when an error correction operation is performed. The up-down controller 168 may control the target gap voltage GAP_TG according to the error correction operation signal ECCOP_ON. For example, when an error correction operation is performed and the error correction operation signal ECCOP_ON is activated, the up-down controller 168 may lower a level of the target gap voltage GAP_TG.

Hereinafter, an internal voltage generating method in accordance with an embodiment of the present invention will be described with reference to FIGS. 1 to 10.

Figure 11:
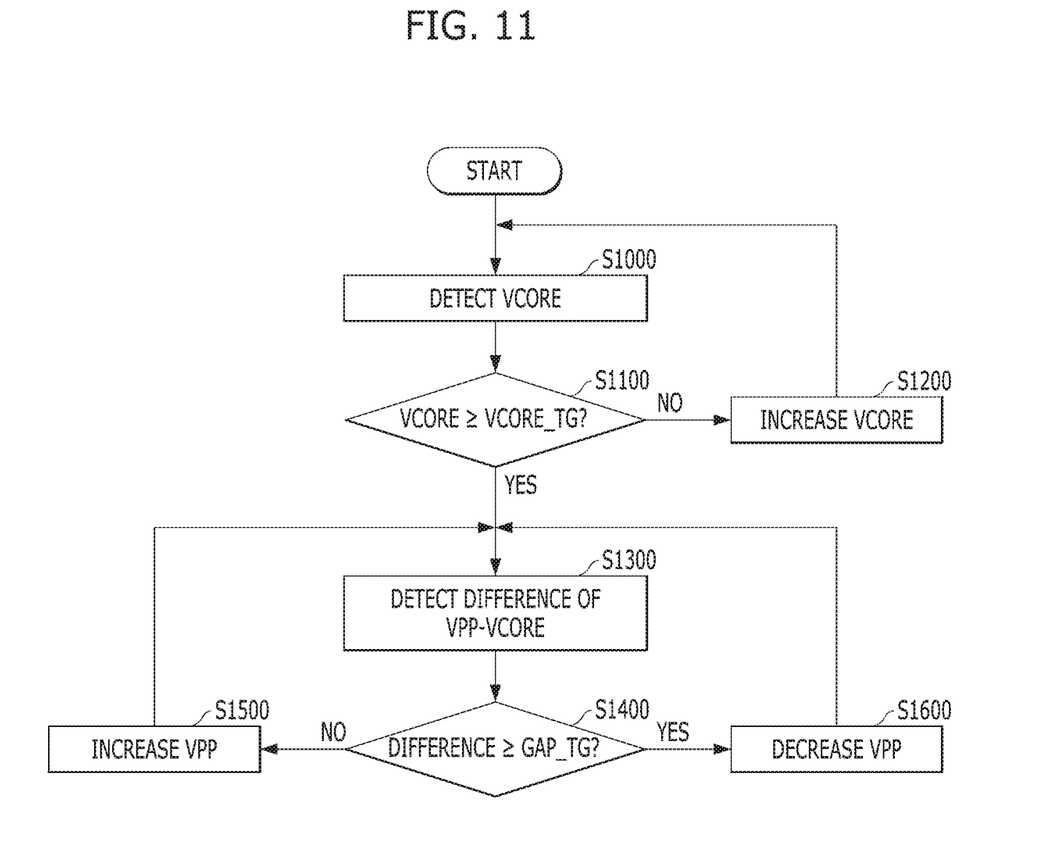
FIG. 11 is a flowchart for describing an internal voltage generation operation in accordance with an embodiment of the present invention.

FIG. 11 is a flowchart for describing an internal voltage generation operation in accordance with an embodiment of the present invention.

Referring to FIG. 11, the core voltage detection circuit 110 may generate the first detection signal DET1 by comparing the core voltage VCORE and the target core voltage VCORE_TG with each other in step S1000 (DETECT VCORE).

When a level of the core voltage VCORE is lower than a level of the target core voltage VCORE_TG in step S1100 (NO), the first detection signal DET1 may become a logic high level. The control circuit 130 may control the first up/down code UP/DN1<1:m> to raise a level of the core voltage VCORE, and thus the core voltage generation circuit 140 may increase a level of the core voltage VCORE to output it in step S1200 (INCREASE VCORE). To be specific, the reference voltage adjuster 142 of the core voltage generation circuit 140 may increase a level of the first reference voltage VREFC according to the first up/down code UP/DN1<1:m>. The core voltage driver 144 may drive the supply voltage VDD according to the increased first reference voltage VREFC to raise a level of the core voltage VCORE.

The above operations of the steps S1000 to S1200 may be repeated until a level of the core voltage VCORE becomes equal to or higher than a level of the target core voltage VCORE_TG.

Conversely, when a level of the core voltage VCORE is equal to or higher than a level of the target core voltage VCORE_TG in step S1100 (YES), the first detection signal DET1 may become a logic low level. The control circuit 130 may omit the operation of adjusting a level of the core voltage VCORE, and activate the operation enable signal GAP_EN.

The voltage difference detection circuit 120 may be enabled in response to the operation enable signal GAP_EN, compare the voltage difference between the core voltage VCORE and the boosted voltage VPP with a predetermined target gap voltage GAP_TG to generate the second detection signal DET2 in step S1300 (DETECT DIFFERENCE BETWEEN VPP AND VCORE).

When the voltage difference is smaller than the target gap voltage GAP_TG in step S1400 (NO), the second detection signal DET2 may become a logic high level. The control circuit 130 may control the second up/down code UP/DN2<1:m> to raise a level of the boosted voltage VPP. As a result, the boosted voltage generation circuit 150 may raise a level of the boosted voltage (VPP) in step S1500 (INCREASE VPP). More specifically, the level detector 152 of the boosted voltage generation circuit 150 may increase a level of the adjusted voltage VADJ by adjusting a division ratio of the boosted voltage VPP according to the second up/down code UP/DN2<1:m>. When a level of the adjusted voltage VADJ is equal to or higher than a level of the second reference voltage VREFP, the level detector 152 may generate an oscillation control signal OSC_EN that is activated by a logic high level, and the charge pump 156 may perform a charge pumping operation to raise a level of the boosted voltage VPP.

Conversely, when a level of the voltage difference is equal to or higher than a level of the target gap voltage GAP_TG in step S1400 (YES), the second detection signal DET2 may become a logic low level. The control circuit 130 may adjust the second up/down code UP/DN2<1:m> to decrease a level of the boosted voltage VPP. As a result, the boosted voltage generation circuit 150 may decrease a level of the boosted voltage VPP in step S1600 (DECREASE VPP). More specifically, the level detector 152 may decrease a level of the adjusted voltage VADJ by adjusting the division ratio of the boosted voltage VPP according to the second up/down code UP/DN2<1:m>. When a level of the adjusted voltage VADJ is lower than a level of the second reference voltage VREFP, the level detector 152 may generate an oscillation control signal OSC_EN that is deactivated by a logic low level, and the charge pump 156 may stop a charge pumping operation to lower a level of the boosted voltage VPP.

FIGS. 12A to 12D are timing diagrams for describing the internal voltage generation operation shown in FIG. 11.

Figure 12A:
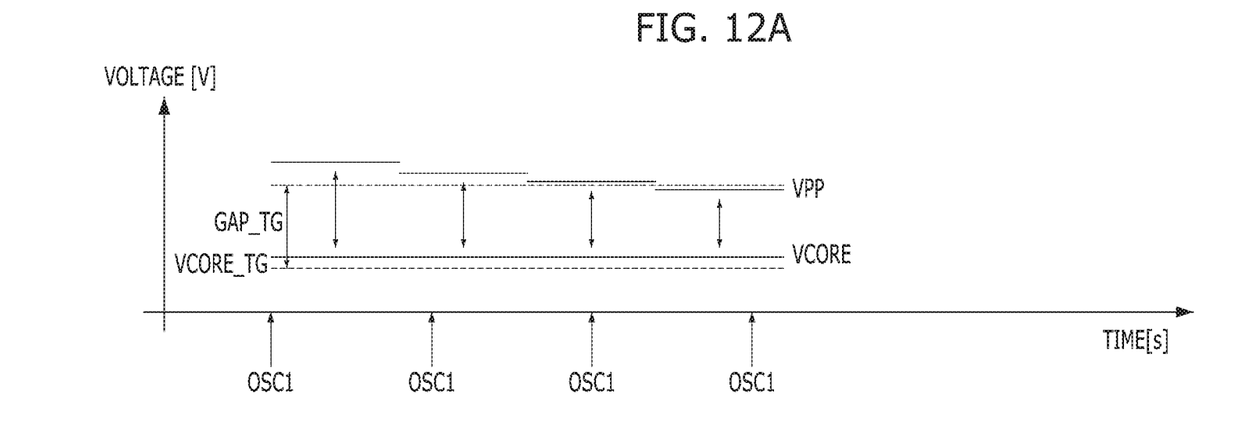
FIGS. 12A to 12D are timing diagrams for describing the internal voltage generation operation shown in FIG. 11.

FIG. 12A shows a case where a level of the core voltage VCORE is equal to or higher than a level of the target core voltage VCORE_TG (the step S1100: YES) and the voltage difference is equal to or greater than the target gap voltage GAP_TG (the step S1400: YES), In these cases, the internal voltage generation device 100 may omit the operation of adjusting a level of the core voltage VCORE, and may decrease a level of the boosted voltage VPP until the voltage difference becomes smaller than the target gap voltage GAP_TG.

Figure 12B:
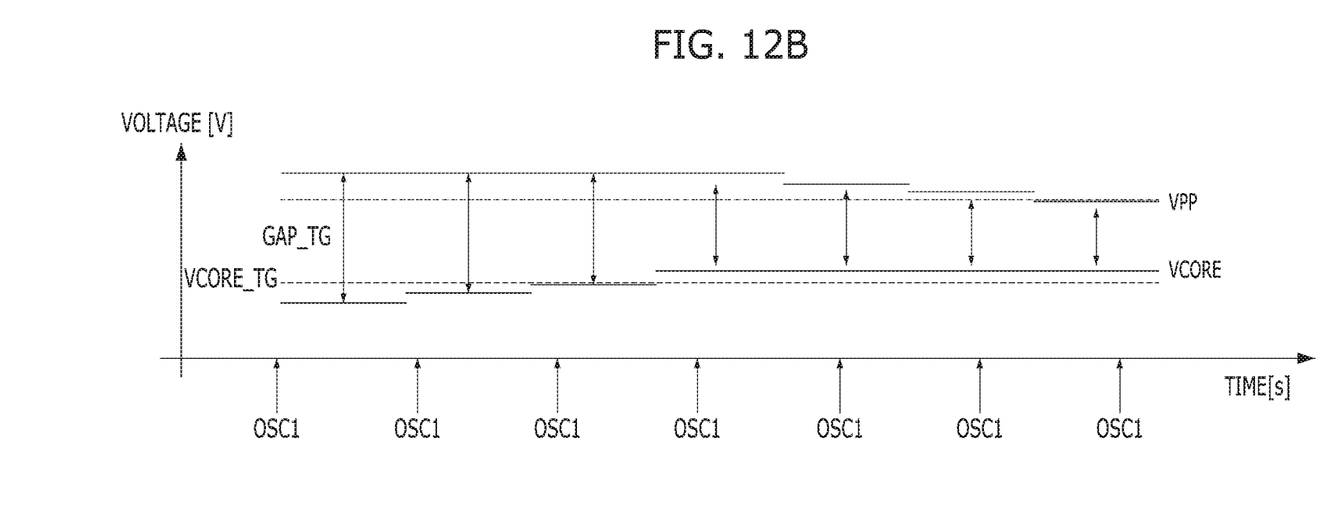

FIG. 12B shows a case where a level of the core voltage VCORE is lower than a level of the target core voltage VCORE_TG (the step S1100: NO) and the voltage difference is equal to or greater than the target gap voltage GAP_TG (the step S1400: YES). In this case, the internal voltage generation device 100 may increase a level of the core voltage VCORE until a level of the core voltage VCORE is equal to or higher than a level of the target core voltage VCORE_TG, and then decrease a level of the boosted voltage VPP until the voltage difference becomes smaller than the target gap voltage GAP_TG.

Figure 12C:
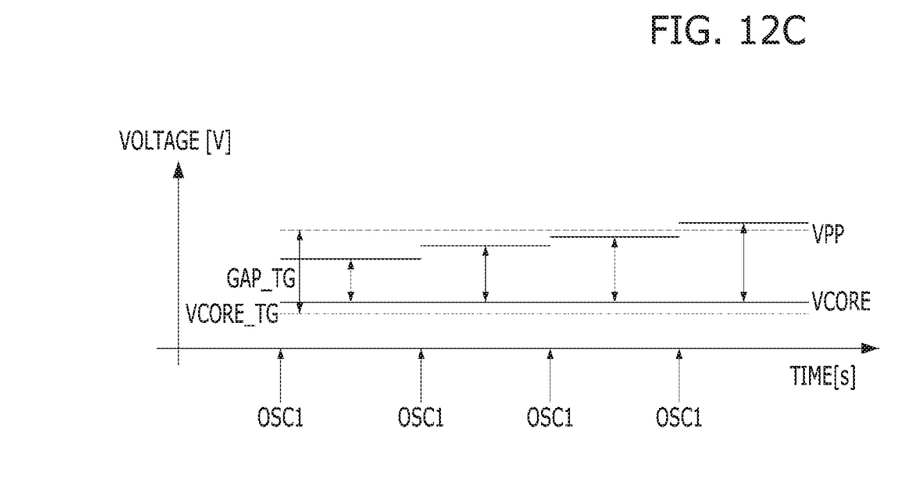

FIG. 12C shows a case where a level of the core voltage VCORE is equal to or higher than a level of the target core voltage VCORE_TG (the step S1100: YES) and the voltage difference is smaller than the target gap voltage GAP_TG (the step S1400: NO). In this case, the internal voltage generation device 100 may omit the operation of adjusting a level of the core voltage VCORE, and may raise a level of the boosted voltage VPP until the voltage difference becomes equal to or greater than the target gap voltage GAP_TG.

Figure 12D:
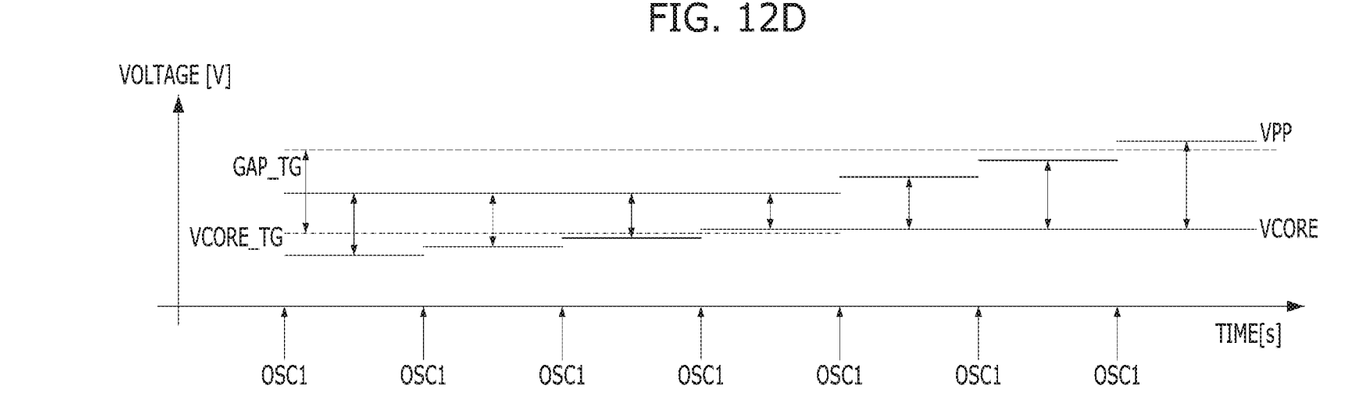

FIG. 12D shows a case where a level of the core voltage VCORE is lower than a level of the target core voltage VCORE_TG (the step S1100: NO) and the voltage difference is smaller than the target gap voltage GAP_TG (the step S1400: NO). In this case, the internal voltage generation device 100 may increase a level of the core voltage VCORE until a level of the core voltage VCORE is equal to or higher than a level of the target core voltage VCORE_TG, and then raise a level of the boosted voltage VPP until the voltage difference becomes equal to or greater than the target gap voltage GAP_TG.

As described above, the present invention may maintain the voltage difference between the core voltage and the boosted voltage of the semiconductor memory device at a uniform level, thereby preventing an operation error from occurring due to a failure. Also, the target gap voltage GAP_TG between the core voltage and the boosted voltage may be set to a static target value as required or changed in real-time, thereby optimizing the voltage difference between the core voltage and the boosted voltage of the semiconductor memory device.

According to the embodiments of the present invention, an internal voltage generation device is able to prevent an operation error from occurring due to a failure by maintaining a predetermined voltage difference between a down-converted voltage (e.g., a core voltage) and a boosted voltage (e.g., a word line driving voltage).

While the present invention has been described with respect to the specific embodiments, it will be apparent to those skilled in the art that various changes and modifications may be made without departing from the spirit and scope of the invention as defined in the following claims.

For example, the logic gates and transistors illustrated in the above embodiments of the present invention may be embodied in different positions and types according to the polarity of input signals.

What is claimed is:

1. A method for generating an internal voltage, comprising:
    comparing a first voltage with a target voltage;
    increasing a level of the first voltage when a level of the first voltage is lower than a level of the target voltage;
    comparing a voltage difference between the first voltage and a second voltage with a target gap voltage in response to an operation enable signal to produce a comparison result; and
    adjusting a level of the second voltage according to the comparison result.

2. The method of claim 1, further comprising:
    activating the operation enable signal when a level of the first voltage is equal to or higher than a level of the target voltage.

3. The method of claim 1,
    wherein a level of the second voltage is increased when the voltage difference is smaller than the target gap voltage, and
    wherein a level of the second voltage is decreased when the voltage difference is equal to or greater than the target gap voltage.

4. The method of claim 1, wherein the adjusting of the voltage level of the second voltage includes:
    generating an adjusted voltage by adjusting a division ratio of the second voltage, and generating an oscillation control signal by comparing the adjusted voltage with a second reference voltage;
    generating a pumping control signal in response to the oscillation control signal; and
    generating the second voltage by performing a charge pumping operation using the supply voltage according to the pumping control signal.

5. The method of claim 1, wherein the comparing of the first voltage with the target voltage includes:
    outputting a first comparison signal by comparing the first voltage with the target voltage in response to a first period signal; and
    latching the first comparison signal, and outputting the latched first comparison signal as a first detection signal in response to a second period signal.

6. The method of claim 1, wherein the increasing of a level of the first voltage includes:
    increasing a level of a first reference voltage; and
    generating the first voltage by driving a supply voltage according to the first reference voltage.

7. The method of claim 1, wherein the comparing of the voltage difference between the first voltage and the second voltage with the target gap voltage includes:
    outputting a voltage difference signal of an analog value corresponding to the voltage difference between the first voltage and the second voltage in response to the operation enable signal;
    outputting a second comparison signal by comparing the voltage difference signal with the target gap voltage in response to a first period signal; and
    latching the second comparison signal, and outputting the latched second comparison signal as a second detection signal in response to a second period signal.

8. The method of claim 1, further comprising:
    outputting a plurality of divided voltages from a plurality of resistors coupled in series between a supply voltage terminal and a ground voltage terminal; and
    selecting one divided voltage from the divided voltages according to a temperature code to output the selected divided voltage as the target gap voltage.

9. The method of claim 1, further comprising:
    generating an error correction operation signal by detecting whether an error correction operation is performed or not; and
    controlling the target gap voltage according to the error correction operation signal.

* * * * *